(12) United States Patent
Probst et al.

(10) Patent No.: US 8,471,569 B2
(45) Date of Patent: Jun. 25, 2013

(54) METHOD AND CIRCUIT ARRANGEMENT FOR MEASUREMENT OF THE CURRENT THROUGH AN INDUCTIVE LOAD

(75) Inventors: Urs Probst, Zug (CH); Ladislav Kucera, Thalwill (CH)

(73) Assignee: CTC Analytics AG, Zwingen (CH)

( * ) Notice: Subject to any disclaimer, the term of this patent is extended or adjusted under 35 U.S.C. 154(b) by 392 days.

(21) Appl. No.: 12/784,557

(22) Filed: May 21, 2010

(65) Prior Publication Data

US 2010/0295557 A1 Nov. 25, 2010

(30) Foreign Application Priority Data

May 22, 2009 (DE) .......................... 10 2009 022 314

(51) Int. Cl.
*G01R 27/08* (2006.01)
*G01R 27/28* (2006.01)

(52) U.S. Cl.
USPC ............ 324/654; 324/705; 324/657; 324/713

(58) Field of Classification Search
USPC .................. 324/654, 656, 657, 725, 690–724
See application file for complete search history.

(56) References Cited

U.S. PATENT DOCUMENTS

| 4,065,708 | A | 12/1977 | Ulland et al. |
| 4,136,308 | A | 1/1979 | King |
| 4,234,838 | A | 11/1980 | Langley et al. |
| 4,286,202 | A | 8/1981 | Clancy et al. |
| 4,510,429 | A | 4/1985 | Squire |
| 4,562,386 | A | 12/1985 | Goff et al. |
| 5,296,787 | A | 3/1994 | Albrecht et al. |
| 5,378,975 | A | 1/1995 | Schweid et al. |
| 5,656,910 | A | 8/1997 | Erckert |
| 5,703,490 | A * | 12/1997 | Kennedy ........................ 324/650 |
| 5,710,495 | A | 1/1998 | Skelton |
| 6,061,258 | A | 5/2000 | Galbiati et al. |
| 2008/0106273 | A1 * | 5/2008 | Bauer et al. .................... 324/656 |

FOREIGN PATENT DOCUMENTS

| DE | 2447673 A1 | 4/1976 |
| DE | 283718 A1 | 3/1979 |
| DE | 2930863 A1 | 4/1981 |
| DE | 4339553 C1 | 6/1995 |
| DE | 102006059048 A1 | 6/2008 |
| EP | 1531544 A2 | 5/2005 |

\* cited by examiner

*Primary Examiner* — Melissa Koval
*Assistant Examiner* — Farhana Hoque
(74) *Attorney, Agent, or Firm* — Birch, Stewart, Kolasch & Birch, LLP

(57) ABSTRACT

The invention provides a method and a circuit arrangement for measurement of the current through an inductive load L wherein the current is fed into the inductive load L with the aid of a full-bridge circuit. By way of example, full-bridge circuits such as these are used to feed a current in a pulse-width-modulated form into a winding of a direct-current, stepping or plunger coil motor. A respective measurement device (Ra, Rb) is provided for each half-bridge. In this case, a respective measurement device (Ra, Rb) is arranged between in each case one series circuit of switching elements and ground (VSS) or the supply voltage (VDD), respectively, at which a respective voltage is tapped off, which is a measure of the current through the respective measurement device. The device for measurement of the current has at least one switching device (S), by means of which one of the two inputs (e1, e2) of differential amplifier (D) can be selectively connected to ground (VSS) or to the supply voltage (VDD), or to one of the two measurement devices.

4 Claims, 15 Drawing Sheets

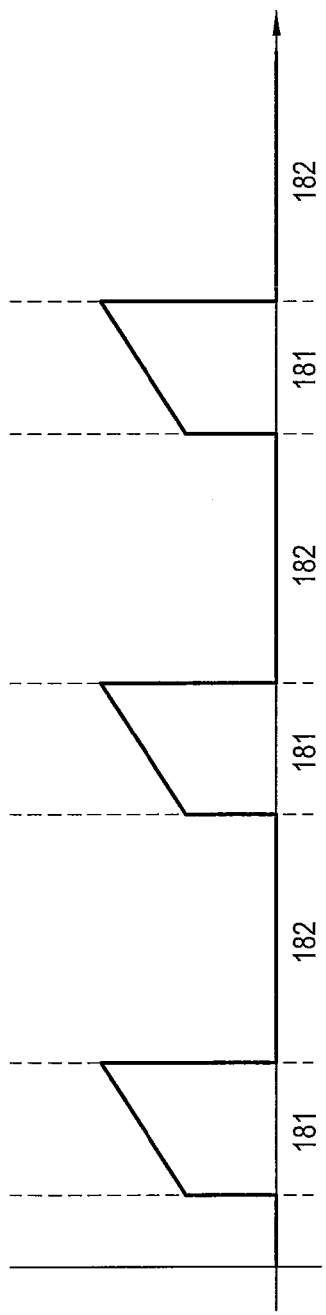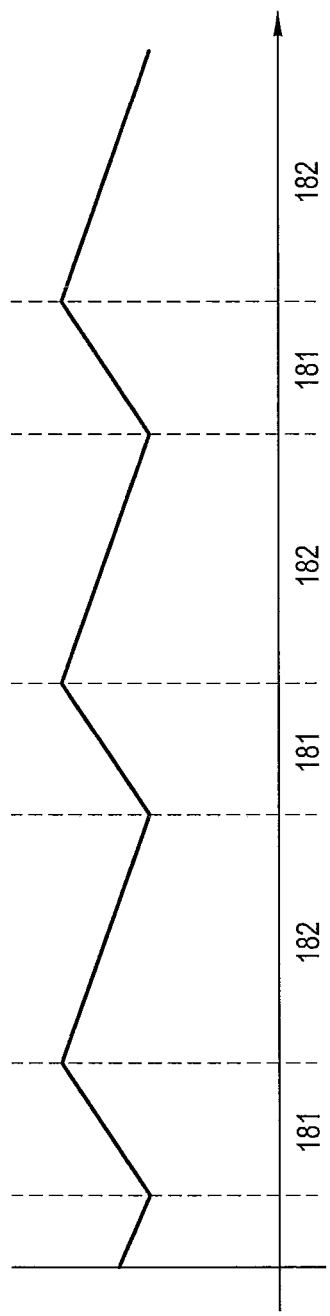

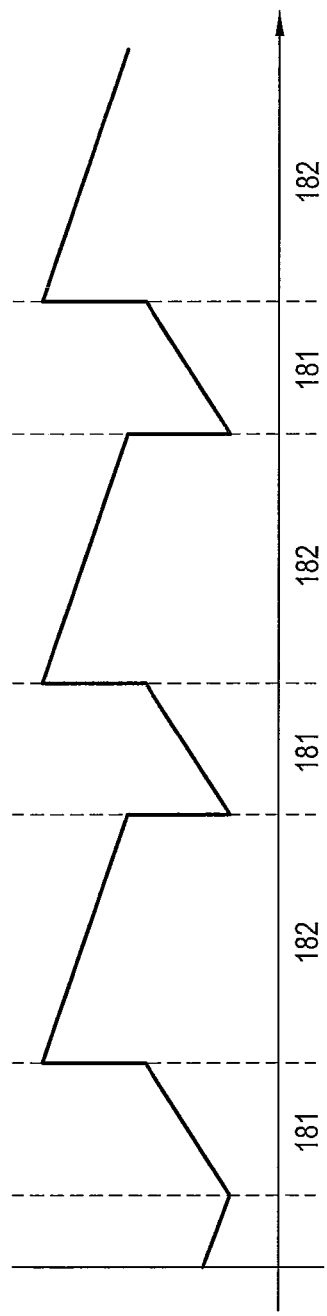
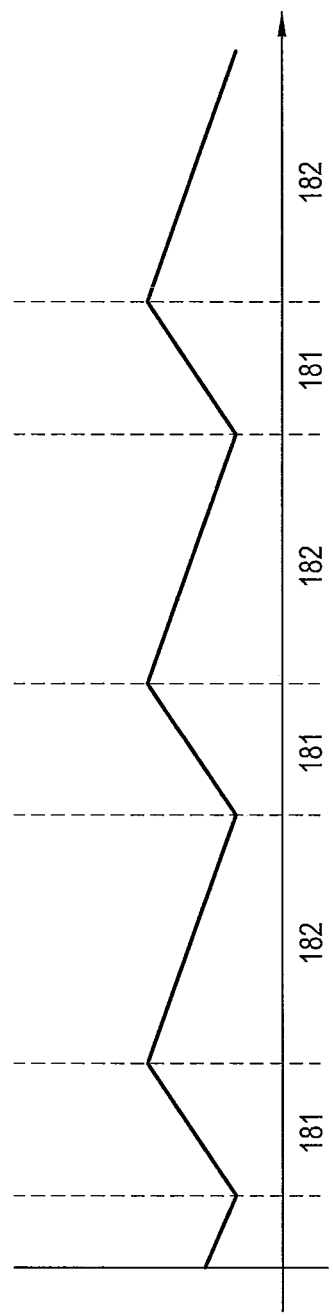

METHOD AND CIRCUIT ARRANGEMENT FOR MEASUREMENT OF THE CURRENT THROUGH AN INDUCTIVE LOAD

The present invention relates to a method and a circuit arrangement for measurement of the current through an inductive load wherein the current is fed into the inductive load with the aid of a full-bridge circuit. By way of example, full-bridge circuits such as these are used to feed a current in a pulse-width-modulated form into a winding of a direct-current, stepping or plunger coil motor.

A current measurement is required in order to control the current in an inductive load, as is represented by a motor. The quality of the current measurement is one of the critical governing factors for the achievable control bandwidth of the motor system, comprising a digital or analog control circuit, the power bridge and the inductive load, for example for a two-phase stepping motor. Good current control also directly affects a possibly superordinate speed and position regulator. Better current control allows higher control stiffnesses to be achieved, resulting in an improvement in terms of control accuracy, the transient time and the disturbance response of the overall system.

The quality of a current measurement may be assessed, inter alia, with the aid of a number of criteria, some of which are dependent on one another. For example, a good current measurement should have as high a signal-to-noise ratio as possible, as little phase shift as possible, and a sufficiently wide bandwidth. On the other hand, there should be no signals above the Nyquist frequency, in order to avoid infringing the sampling theorem. The Nyquist frequency is in this case defined by the sampling frequency of a sampling circuit for analog/digital conversion purposes, for converting the original analog measurement variable to a signal which can be processed further digitally. As is known, this is a maximum of half the sampling frequency of the sampling circuit. This last condition can be satisfied only if the measurement signal is spectrally limited in a suitable manner.

Known methods or circuit arrangements for measurement of the current do not satisfy these criteria, or satisfy them only inadequately, or involve a high level of cost-driving circuitry complexity.

In these methods, the current is measured either directly in the supply line to the inductive load or in one of the two feed lines to the bridge circuit. The latter is more cost-effective and is therefore often preferred, but means that the signal is not available continuously over time, which may be disadvantageous in some cases.

U.S. Pat. No. 6,061,258 describes a current measurement in the supply line to the inductive load; persons skilled in the art also refer to this method as "high-side" measurement. The measurement signal is continuously available. Since the current in the inductive load increases and decreases continuously because of the pulse-width modulation (PWM), the aim is to measure the current precisely at the time at which it passes through the theoretical mean value over time, and then to store it. The current is therefore measured at discrete times. Any disturbances which may be present at the measurement time, for example by switching a second, independent phase in the immediate vicinity, likewise affect the measurement signal. Signal filtering which is correct from the Nyquist criterion point of view is then frequently no longer possible because of the discrete character of the measurement signal.

EP 1 531 544 A2 describes a current measurement in the feed line to the bridge circuit. In this case, the current in the inductance can be measured only at specific times, specifically precisely when the current is flowing diagonally through the bridge circuit. When the current is circulating within the bridge, that is to say either of the two upper or the two lower switches is closed, then no current flows through the measurement resistor, and in consequence no measurement is possible, either. Furthermore, the measured current will sometimes be positive and sometimes negative, depending on the switch position in the bridge. Once again, signal filtering which is correct in accordance with the Nyquist criterion is not possible here.

U.S. Pat. No. 4,562,386 solves this polarity problem by demodulation or rectification. However, in this case as well, the current signal is continuous only when there is no recirculation within the bridge—with either two closed upper switches or lower switches.

Infringements of the Nyquist criterion are also caused or promoted, inter alia, by discontinuities (sudden changes, sudden measurement signal changes) in the measurement signal. By way of example, DE 29 30 863 A1 discloses a method for load-current detection in a direct-current reverser, and a circuit arrangement for carrying out the method, by means of which these problems and the polarity problem are intended to be avoided. However, the circuit arrangement specified here is very complex, with three operational amplifiers per full-bridge, and is therefore costly.

The present invention is based on the object of specifying a method which is as powerful as possible and can be implemented as cost-effectively as possible, and a circuit arrangement which is as powerful as possible and can be implemented as cost-effectively as possible, for measurement of the current through an inductive load, with the current being fed into the inductive load with the aid of a full-bridge circuit. This object is achieved by a method and a product according to one of the independent claims. Advantageous developments of the invention form the subject matter of dependent patent claims.

The invention provides a method and a circuit arrangement for measurement of the current through an inductive load, into which the current is fed with the aid of a full-bridge circuit. The full-bridge circuit has two identical half-bridges, which each comprise two series-connected switching elements. The inductive load is connected to the center taps of the half-bridges. A voltage is tapped off from each of two measurement devices, and this voltage is a measure of the current through the respective measurement device. In this case, a respective measurement device is arranged between a respective series circuit of switching elements and ground or the supply voltage. These voltages are supplied to a differential amplifier, whose inputs are respectively connected to one of the two measurement devices. With the aid of a switching device(s), one of the two inputs of the differential amplifier is selectively connected to ground or the supply voltage or to one of the two measurement devices.

In this case, the wording "can be selectively connected to ground (VSS) or to the supply voltage (VDD), or to one of the two measurement devices" is intended to mean that, in the situation in which the measurement devices are arranged between in each case one series circuit of switching elements and ground (VSS), the switching device can selectively connect one of the two inputs of the relevant differential amplifier selectively to ground or to one of the two measurement devices, and in that in the other case, in which the measurement devices are arranged between in each case one series circuit of switching elements and the supply voltage (VDD), the switching device can connect one of the two inputs of the relevant differential amplifier selectively to the supply voltage (VDD) or to one of the two measurement devices.

For the purposes of the description of the present invention, a measurement device means any device which is suitable for measurement of a current, in particular a measurement resistor or, for example, a Hall element, that is to say a current-measurement device based on the magnetic Hall effect. Other measurement devices are not precluded. A voltage measured at a measurement device is "a measure of the current" which is intended to be measured, for the purposes of the present invention, if the current to be measured can be unambiguously reconstructed from this measured voltage on the basis of a functional relationship.

For the purposes of the description of the present invention, a measurement resistor means an electrical resistor in which the voltage which can be tapped at its ends is, to an adequate approximation—for the purposes of measurement in the context of the present invention—a measure, that is to say for example is proportional—to the current flowing through the resistor. The proportionality constant is known sufficiently accurately and possibly so depends on other influencing variables, such as the temperature. Where the influences on the measurement accuracy are relevant, they are assumed to be known and to be appropriately taken into account.

In the case of one preferred embodiment of the invention, in which the measurement devices are measurement resistors, the wording "connected to one of the two measurement devices" means that the input of the differential amplifier is connected to that terminal of the measurement resistor which is in each case opposite the terminal which is connected to ground (VSS) or to the supply voltage (VDD).

For the purposes of the description of the present invention, a differential amplifier is intended to mean any electrical circuit which is suitable for processing two analog input signals, which vary over time, such that an analog difference signal between the two input signals is available at the output of this circuit. Furthermore, a differential amplifier may have amplification and a filter effect.

For the purposes of the description of the present invention, a bridge circuit or full-bridge circuit means an electrical circuit comprising switching elements which can supply current to an inductive load, for example can connect a winding or a plurality of windings of a motor, for example of a stepping motor, in various ways to an electrical power supply, such that the current can flow in specific directions through the inductive load, that is to say by way of example through the relevant windings of the motor, at specific times. This can preferably also be done with the aid of so-called pulse-width modulation, in which the switching elements can essentially be switched only between two states "on" and "off", wherein the duration of the times, the so-called pulse widths, during which the switching elements assume one of these states governs the average voltage applied to the inductive load. This voltage causes a current to flow in the inductive load. Therefore, in this method, the length of the time intervals during which the voltage is switched on and off in the form of a binary step function therefore codes the time profile of the current through the inductive load, for example a sine-wave function, in the sense that the low-frequency component of the step function is actually the sine-wave function, or some other desired profile of the current over time.

For the purposes of the description of the present invention, a switching element means an electrical or electronic component with the aid of which it is possible to control the current through a conductor—preferably via a control voltage or a control current. Preferred examples of switching elements such as these are electromagnetic switches such as so-called relays, bipolar transistors or field-effect transistors. Further examples of switching elements would be optoelectronic switches or similar controllable resistors, whose resistance is dependent on a controlled variable.

The invention will be described in more detail in the following text with reference to preferred exemplary embodiments and with the aid of figures. In doing so, the relatively general character of the present invention is not intended to be restricted, where this is done when using examples to provide a better illustration, and the present invention relates in an entirely general form to the measurement of the current through an inductive load, with the current being fed into the inductive load with the aid of a full-bridge circuit.

Figure 2:
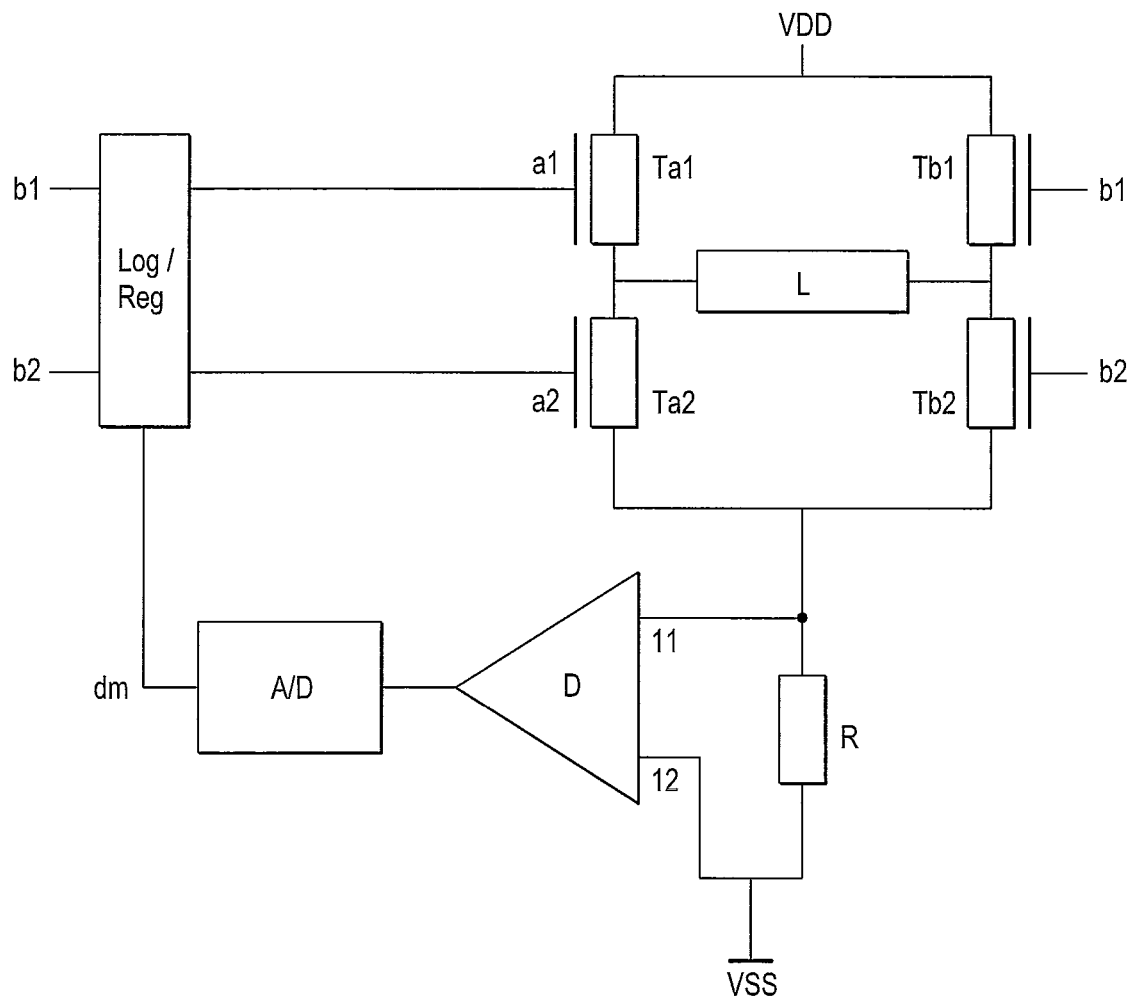
FIG. 2 shows a modification of the basic circuit shown in FIG. 1, having only one full-bridge, but also having a device for measurement of the current in the inductive load L.
Figure 5:
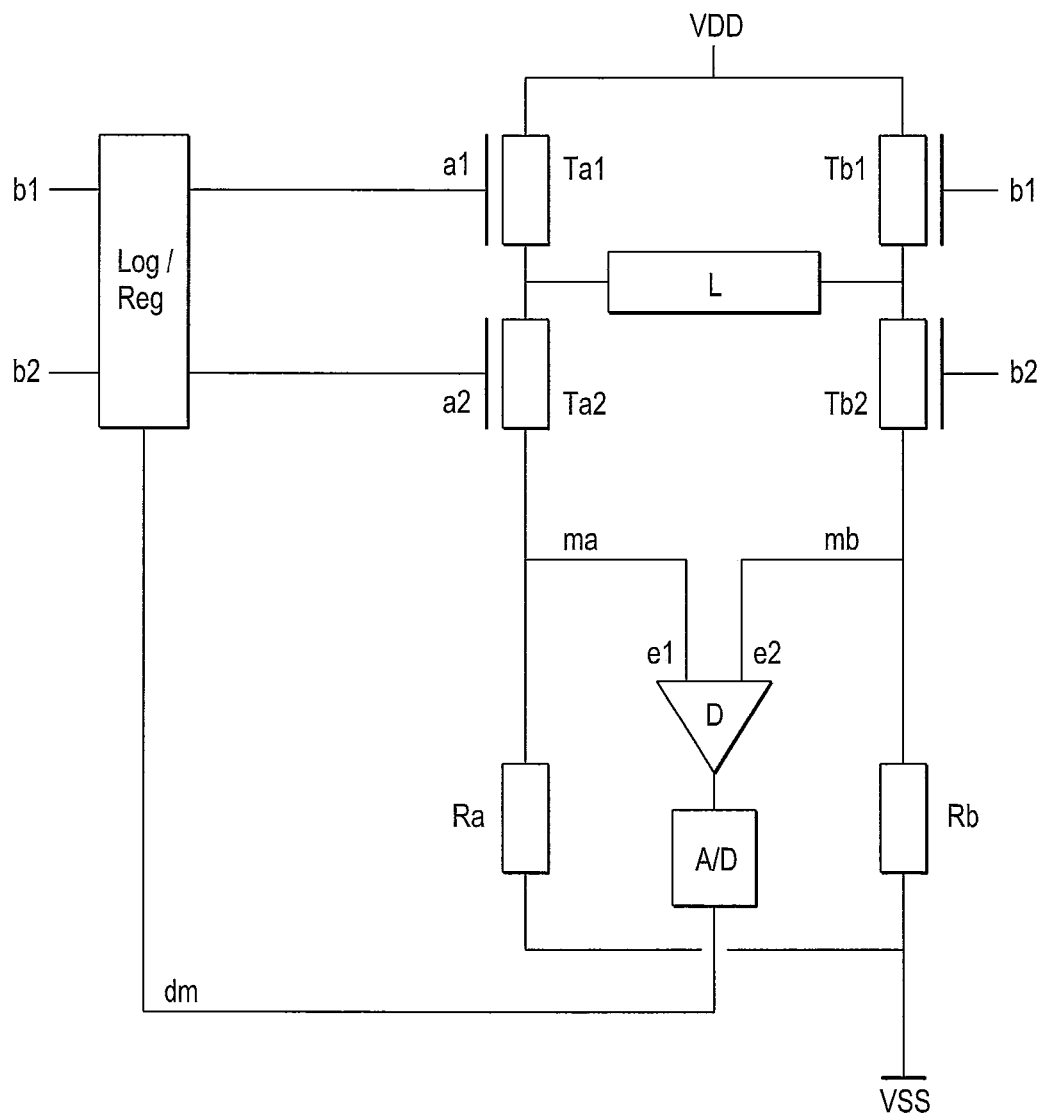
FIG. 5 shows an example of a full-bridge circuit having an inductive load and a respective measurement resistor on each side of an inductance, and devices for measurement of the current differences through the two measurement resistors of a winding.
Figure 8:
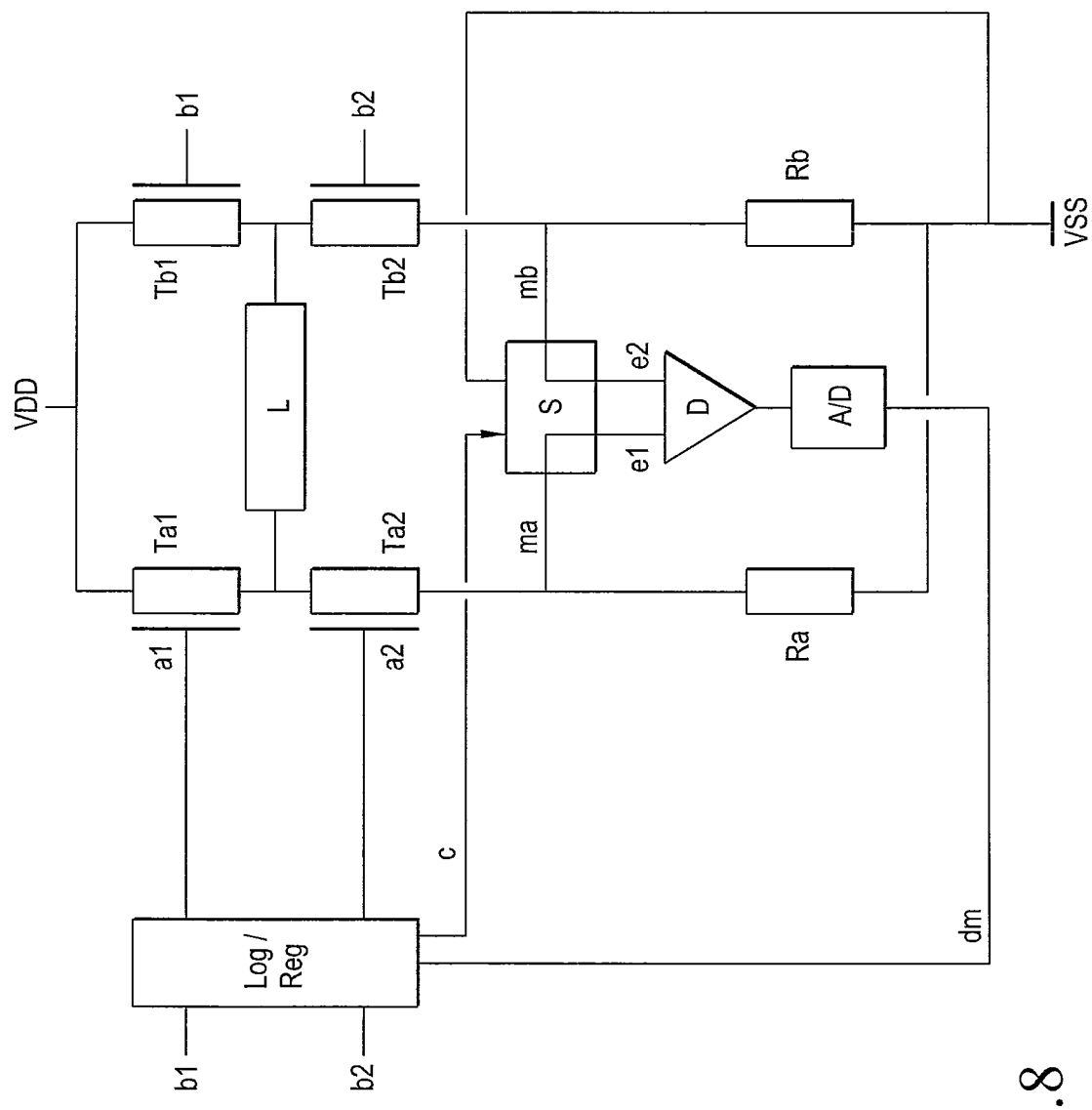
FIG. 8 shows one exemplary embodiment of the present invention, having a switching element S1 which can selectively connect and disconnect the measurement signals to and from the difference circuit.
Figure 13:
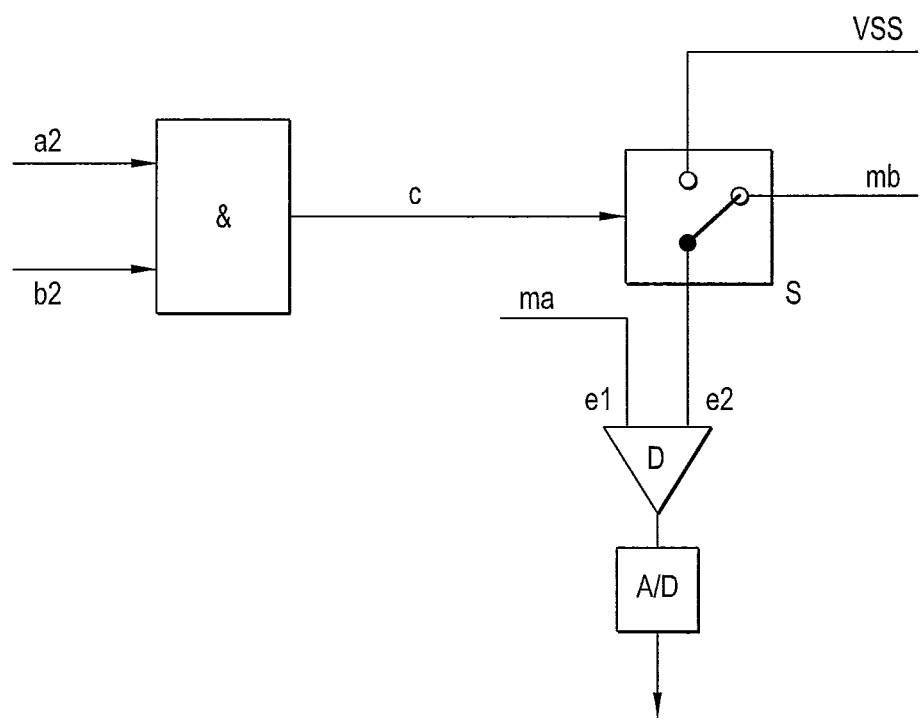
Figure 14:
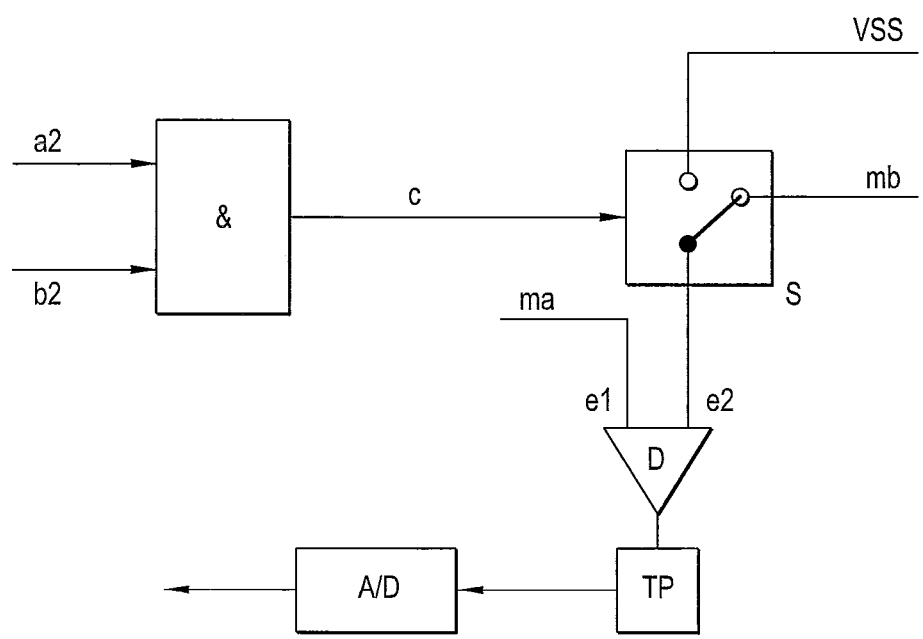
Figure 15:
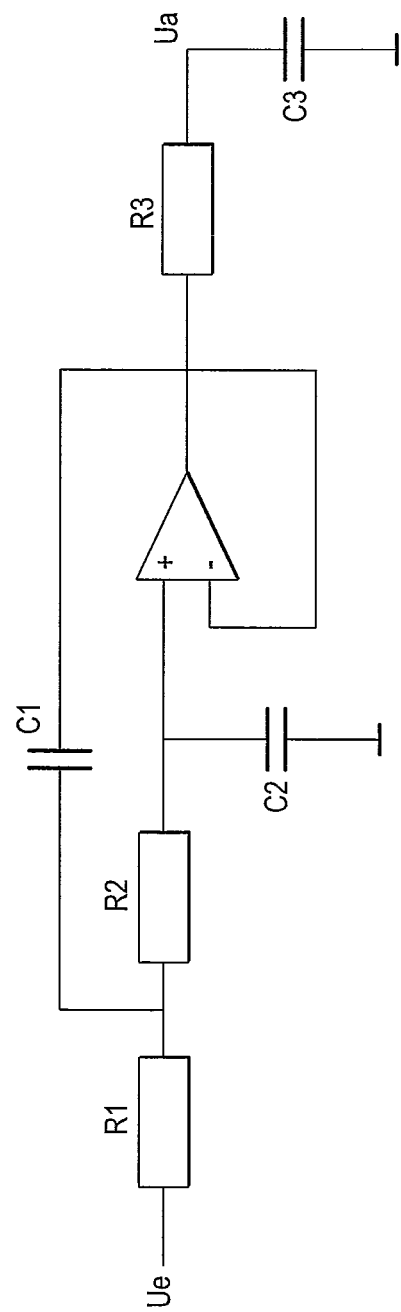

FIG. 11*a* shows, in a qualitative and simplified manner, the time profile of the measurement variable for the current in a circuit as shown in FIG. 2;

FIG. 11*b* shows, in a qualitative and simplified manner, the time profile of the current through a winding of the circuit as shown in FIG. 2;

FIG. 12*a* shows, in a qualitative and simplified manner, the time profile of the measurement variable for the current in a circuit as shown in FIG. 5;

FIG. 12*b* shows, in a qualitative and simplified manner, the time profile of the measurement variable for the current in a circuit as shown in FIG. 8;

FIG. 13 shows a partial circuit of a circuit arrangement according to the invention, according to one preferred embodiment of the invention;

FIG. 14 shows a modification of the partial circuit illustrated in FIG. 13, according to one preferred embodiment of the invention;

FIG. 15 shows a basic circuit for an active low-pass filter (TP).

The invention provides a method and a circuit arrangement for measurement of the current through an inductive load wherein the current is fed into the inductive load with the aid of a full-bridge circuit. By way of example, full-bridge circuits such as these are used to feed a current in a pulse-width-modulated form into a winding of a direct-current, stepping or plunger coil motor. A respective measurement device (Ra, Rb) for example a measurement resistor, is provided for each half-bridge. In this case, a respective measurement resistor is arranged between in each case one series circuit of switching elements and ground (VSS) or the supply voltage (VDD), at which a respective voltage is tapped off, which is proportional to the current through the respective measurement resistor. The device for measurement of the current has at least one switching device (S), by means of which one of the two inputs (e1, e2) of a differential amplifier can be selectively connected to ground (VSS) or to the supply voltage (VDD), or to one of the two measurement devices.

Figure 1:
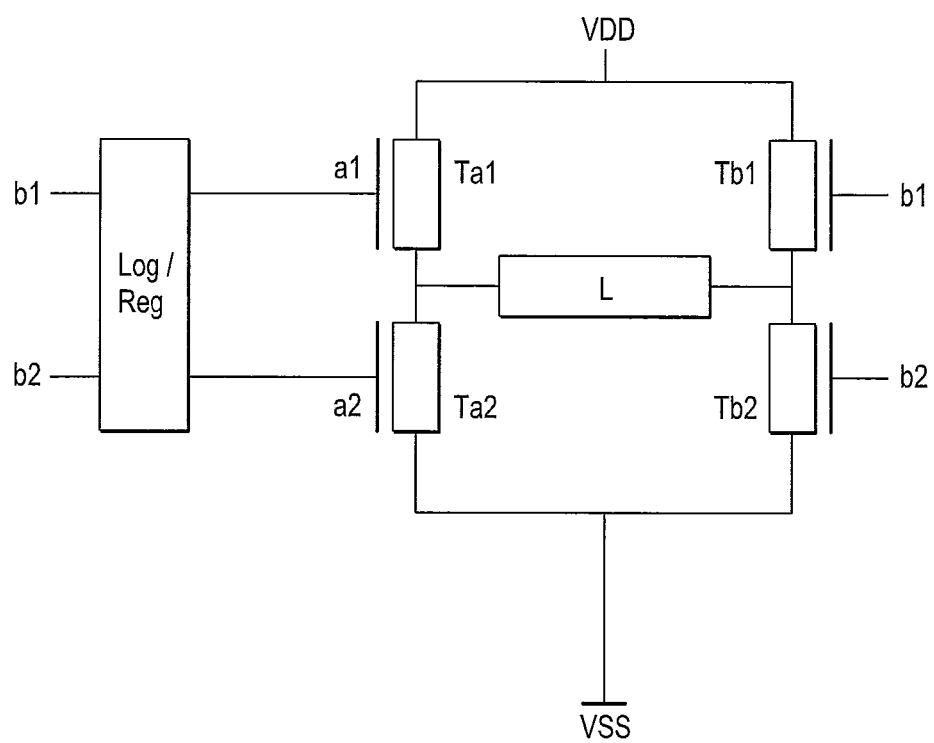
FIG. 1 shows a basic circuit of a full-bridge circuit for controlling inductive loads, for example the windings of a stepping motor.

As is shown in FIG. 1, so-called bridge circuits which have two series circuits of switching elements (Ta1, Ta2, as well as Tb1 and Tb2) connected in parallel are normally used to control the current direction and possibly also the current level through an inductive load. The control contacts a1, a2, b1 and b2 of these switching elements are each driven by a logic circuit Log, which itself is driven by a control circuit Reg which, inter alia, produces a pulse-width-modulated signal for the two half-bridges, governing the average voltage of both sides of the inductive load. Subordinate control Reg and current measurement make it possible to ensure that a specific current is passed through the inductive load.

FIG. 2 shows one simple possible way to measure the current through the inductance and to make the measurement result available to the control logic. For this purpose, the voltage m across a measurement resistor R is measured with the aid of an operational amplifier D and is converted with the aid of an analog/digital converter A/D to a digital signal dm, which is then supplied to a control circuit Reg for evaluation and control.

Figure 3:
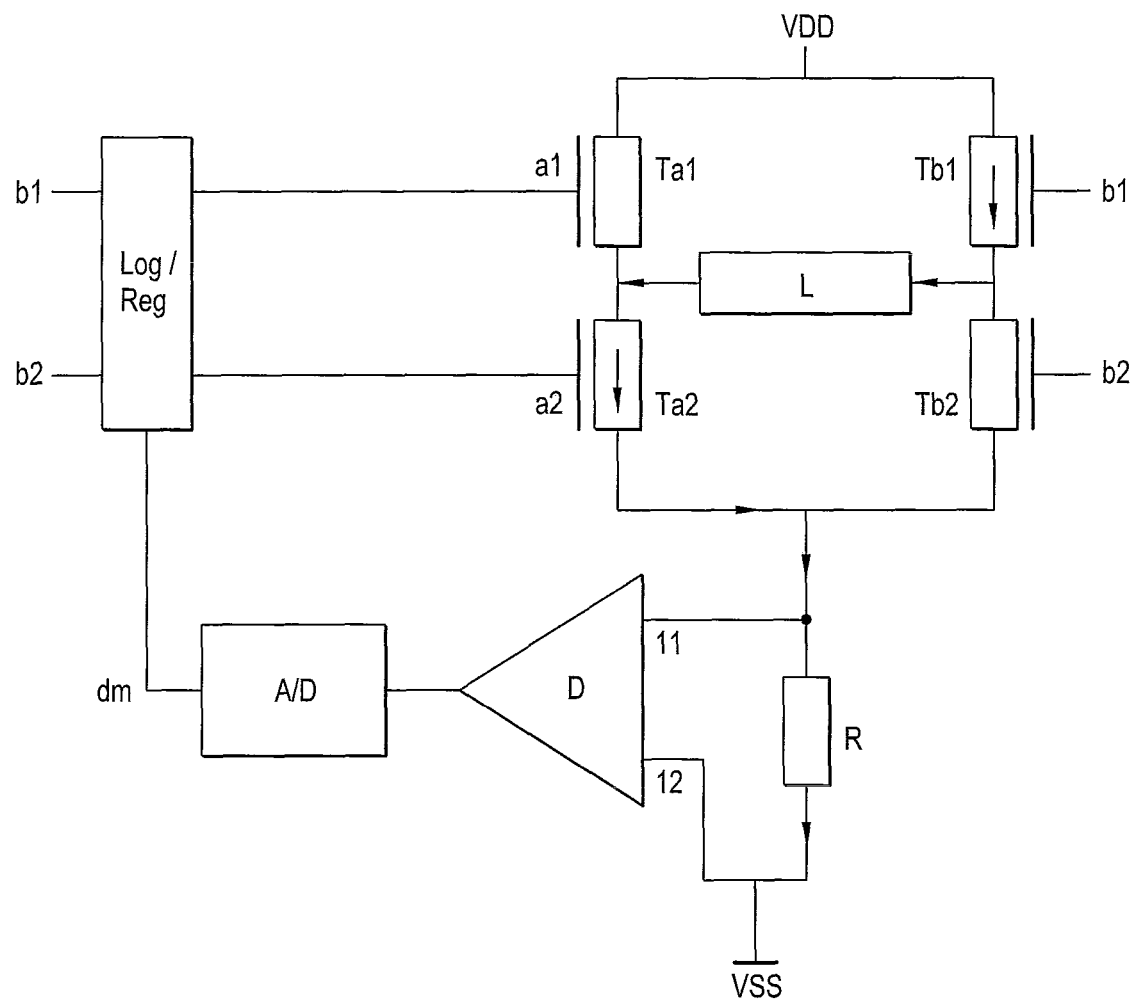
FIG. 3 shows the circuit illustrated in FIG. 2 in a driven phase (drive phase), during which a drive current flows through the inductive load and the measurement resistor.

FIG. 3 shows the current flow through an inductance L and some of the switching elements Tb1 and Ta2, as well as the current flow through the measurement resistor R in the circuit shown in FIG. 2, in an inductance drive phase. The current through the measurement resistor R produces a voltage m at the upper end of this resistor, which is connected to ground (VSS), which voltage m is supplied to the input 11 of a differential amplifier D, whose second input is connected to ground. An analog/digital converter A/D converts the output signal from this differential amplifier D to a corresponding digital signal dm, which is supplied to the control circuit Reg in order to control the bridge circuits.

Figure 4:
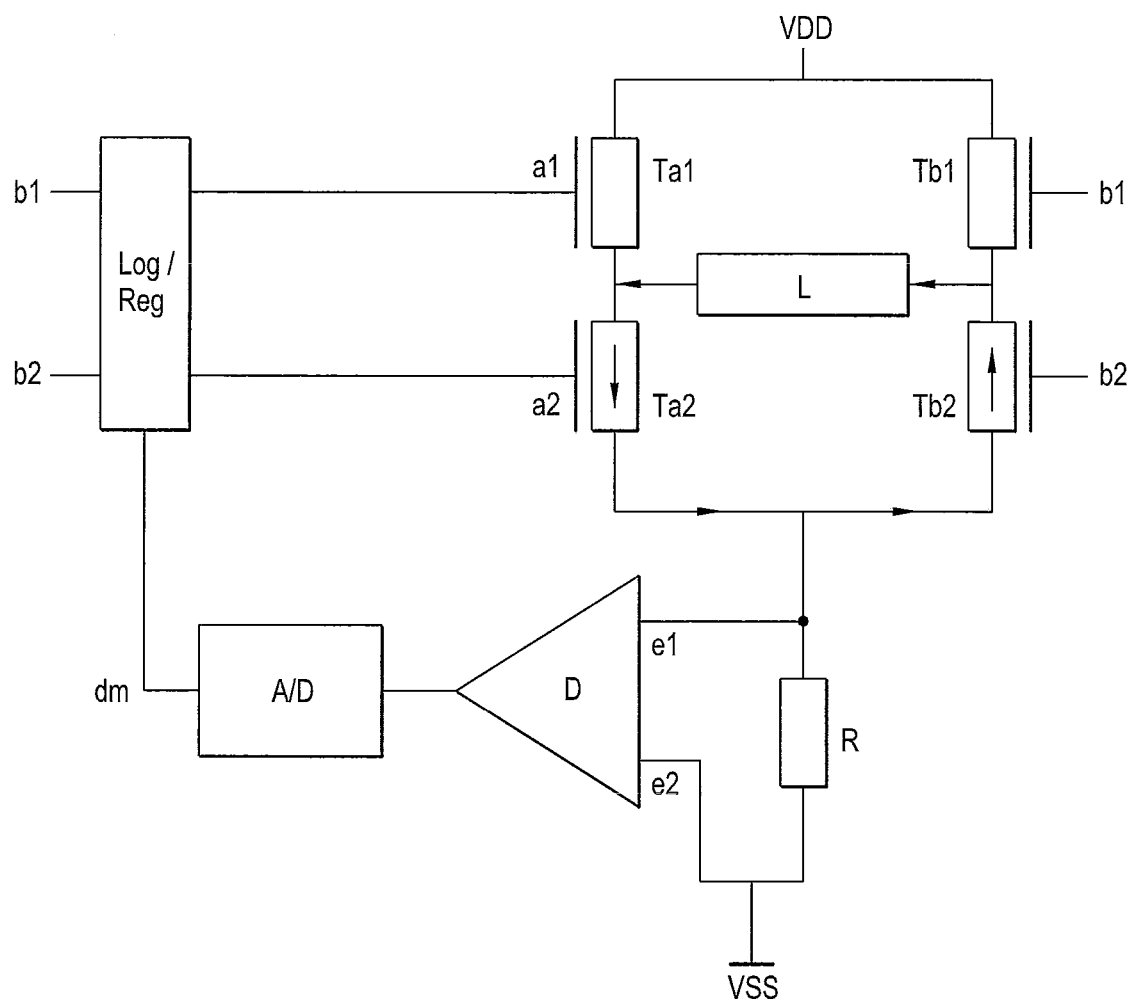
FIG. 4 shows the circuit illustrated in FIG. 2 in a recirculation phase, during which no current flows through the measurement resistor.

FIG. 4 shows the same circuit in a recirculation phase during which the recirculation current flows through the winding L and through the switching elements Ta2 and Tb2. Since this current does not flow through the measurement resistor R, it cannot be measured by the current measurement circuit (D, A/D). The output signal from the differential amplifier D therefore falls to zero during the recirculation phases. FIG. 11a shows the time profile of the output signal of the differential amplifier D of this circuit during the drive phases 181 and the recirculation phases 182. For comparison, FIG. 11b shows the time profile of the current through the inductance L during the drive phases 181 and the recirculation phases 182.

In the circuit shown in FIG. 2, intrinsically available information is thus sacrificed, because only the sum of the currents through the inductance L can be measured across the single measurement resistor. This may possibly be sufficient if one is interested only in the current levels during the "driven" phases "the drive phases", in which a current flows through each of the windings, which flows from the supply voltage (VDD) through one of the two upper switching elements (Ta1 or Tb1), through the inductance L and through one of the lower switching elements (Ta2 or Tb2).

However, in order to minimize losses, so-called recirculation phases are introduced between these "driven" phases, in which the inductance is short-circuited for a certain time, that is to say in which a current flows through L and through both lower switching elements Ta2 and Tb2. This recirculation current, which is fed from the magnetic field of the inductance L, does not flow through the measurement resistor R in the circuit shown in FIG. 2. For this reason, the recirculation current cannot be measured by means of the circuit shown in FIG. 2.

One exemplary embodiment of the present invention now provides in each case two measurement resistors (Ra and Rb), wherein in each case one measurement resistor is arranged between in each case one series circuit of switching elements and ground (VSS) or the supply voltage (VDD), and on each of which a voltage is tapped off which is proportional to the current through the respective measurement resistor (Ra and Rb), and wherein a differential amplifier (D) is provided for each pair of measurement resistors (Ra, Rb) and its inputs are respectively connected to one of the two measurement resistors (Ra, Rb) of the inductance whose current is measured.

The circuit illustrated in FIG. 5 shows one circuit example in which two measurement resistors (Ra, Rb) are in each case provided for the inductance, and wherein in each case one measurement resistor is arranged between a respective series circuit (Ta1, Ta2 or Tb1, Tb2, respectively) of switching elements and ground (VSS), across which a respective voltage ma, mb is tapped off, which is proportional to the current through the respective measurement resistor (Ra, Rb). This has the advantage that recirculation currents can now also be measured, because they flow through both measurement resistors (Ra and Rb).

Figure 6:
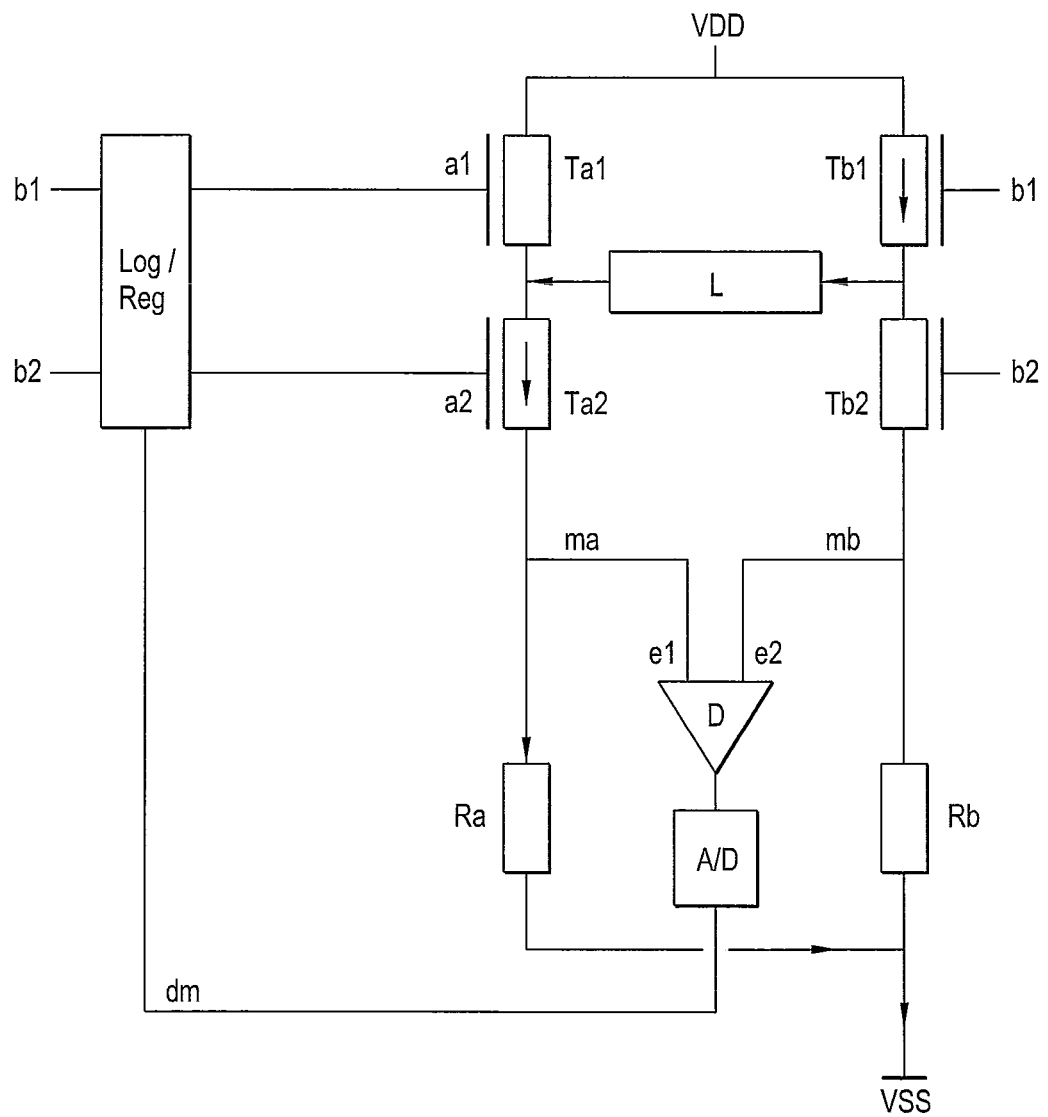
FIG. 6 shows the circuit example illustrated in FIG. 5 in a driven phase, during which a drive current flows through the inductance and one of the two measurement resistors.

FIG. 6 shows this circuit in a drive phase, during which a drive current flows through the switching elements Tb1 and Ta2, through the inductance L and through the measurement resistor Ra. The current through Ra leads to a voltage ma at the input 11 of the differential amplifier D, while in contrast no current flows through Rb, the potential mb is the same as that of ground VSS. The difference between the two signals is therefore equal to ma or is equal to −ma, depending on the mathematical sign of the two inputs e1 and e2.

The figures do not show the current profile during the opposite drive phase, in which a drive current flows through the switching elements Ta1 and Tb2, through the inductance L and through the measurement resistor Rb. This current through Rb leads to a voltage mb at the input e2 of the differential amplifier D, while in contrast no current flows through Ra, because the potential ma is of the same as that of ground VSS. The difference between the two signals is therefore equal to mb or equal to minus mb, depending on the mathematical sign of the two inputs 11 and 12.

After the drive current has been switched off in a drive phase, this is followed in some control circuits by a recirculation phase which is used to entirely or partially dissipate the magnetic field of the inductance built up during the drive phase, in order to achieve the desired, average current. During these recirculation phases, the recirculation current flows through the inductance. Recirculation phases typically occur between two drive phases of a stepping motor which is driven using the pulse-width-modulation method, instead of having to reduce the current by polarity reversal or reversal of the drive phase.

Figure 7:
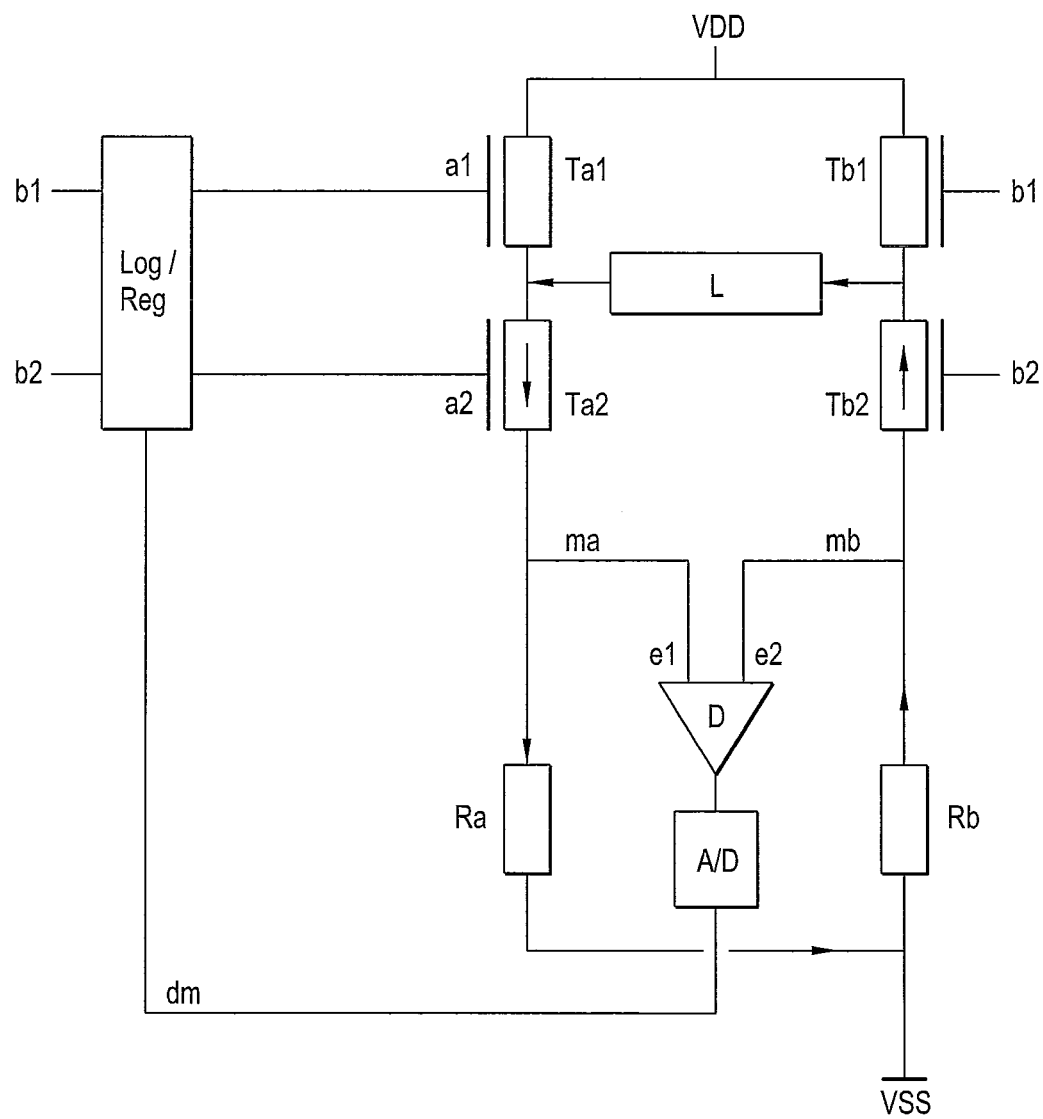
FIG. 7 shows the example illustrated in FIG. 5 in a recirculation phase, during which the recirculation current flows through both measurement resistors.

In FIG. 7, which shows this circuit during a recirculation phase, the recirculation current flows through the two measurement resistors Ra and Rb. The voltages ma and mb have the same magnitudes but opposite mathematical signs, as a result of which their difference, the output signal from the differential amplifier D, is not zero, and is proportional to the level of the recirculation current. The recirculation current can therefore be measured using the circuit shown in FIG. 5.

When the bridge enters a recirculation mode, by two "lower" switching elements Ta2 and Tb2 being switched on, then the current flows through both measurement resistors Ra and Rb. In consequence, this subtraction circuit shown in FIGS. 5, 6 and 7 measures twice the current $I-(-I)=2 \cdot I$.

FIG. 12a shows the time profile at the output of the differential amplifier D in the circuit shown in FIG. 5 during the drive phases 181 and the recirculation phases 182. As can be seen from this figure, the output signal does not fall to zero in the recirculation phases, and the recirculation currents can therefore now be measured, although the time profile of the signal at the output of the differential amplifier D in the circuit shown in FIG. 5 does not yet correspond overall to the profile of the current as is shown in FIG. 11b. This is because of the discontinuities which occur at the transitions between the drive phases 181 and the recirculation phases 182, because twice the current 2*I is measured, instead of the current I itself, in this phase (182).

A signal such as this can obviously not be sensibly filtered. This would result in a corrupted signal whose mean value would be dependent on the actual current or else the pulse width of the pulse-width modulation.

Furthermore, correct filtering for digital sampling, in order to satisfy the known Nyquist sampling theorem, would be considered complex and expensive, because of the major discontinuities in the signal at the modulation frequency.

On the other hand, infringement of the sampling theorem would result in the difficulties, as known by any person skilled in the art, of so-called "aliasing", that is to say signal corruption caused by the infringement of the sampling theorem. If the sampling theorem is infringed, the digital signals d1 no longer reflect the values of the measured difference (ma−mb) without corruption. The highly undesirable consequence of this corruption would be interference with the current control, in some cases series interference, which can result in instabilities of all types in the response of the overall system, for example of a stepping motor.

One embodiment of the present invention now envisages the devices for measurement of the currents each being equipped with a switching device S1, by means of which one of the two inputs e1, e2 of the differential amplifier D can be selectively connected to ground (VSS) or to one of the two measurement resistors (Ra, Rb) whose current is measured.

In the simplest case, according to one preferred embodiment of the invention, this switching device is a simple switch S which—as is illustrated in FIGS. 8, 9, 10, 13 and 14 on the basis of the various states of exemplary embodiments of a circuit arrangement according to the invention—is driven with the aid of a control signal c. This control signal can be derived very easily by a logic operation for example on the "gate signals" a2, b2 of the switching elements, since these signals determine the time periods during which two "lower" switching elements are switched on at the same time. This signal c is therefore used in order to "mask out" the measurement of a half-bridge during these times, by applying the appropriate reference potential (VSS) to an input of the differential amplifier D.

A correct map of the current in the inductive load is therefore available at all times. This can now be filtered in the conventional analog form, with a second-order low-pass filter preferably being integrated in the differential amplifier D for this purpose, with a downstream pattern RC element, thus creating a third-order low-pass filter. FIG. 15 shows a corresponding basic circuit.

For the situation in which the measurement resistors are not arranged between ground VSS and the "low" switching elements Ta2 and Tb2, but between the supply voltage VDD and the "upper" switching elements Ta1 and Tb1, the present invention provides a corresponding preferred embodiment, in which the devices for measurement of the currents are each equipped with a switching device S, by means of which one of the two inputs e1, e2 of a differential amplifier D can be selectively connected to the supply voltage VDD or to one of the two measurement resistors (Ra, Rb) whose current is measured.

If this switching device S is controlled appropriately, it is possible to overcome the discontinuities and/or the steep flanks in these signals at the transitions, as shown in FIG. 12a, between the drive phases 181 and the recirculation phases 182, and to match the qualitative profile of the measured signals as shown in FIG. 12b to the qualitative profile of the current through the inductance L shown in FIG. 11b. To do this, the present invention provides for one of the two inputs (e1, e2) of the differential amplifier (D) to be connected to ground (VSS) or to the supply voltage (VDD) and not to one of the two measurement resistors (Ra, Rb), when the current through the inductive load flows through both measurement resistors at the same time.

Figure 9:
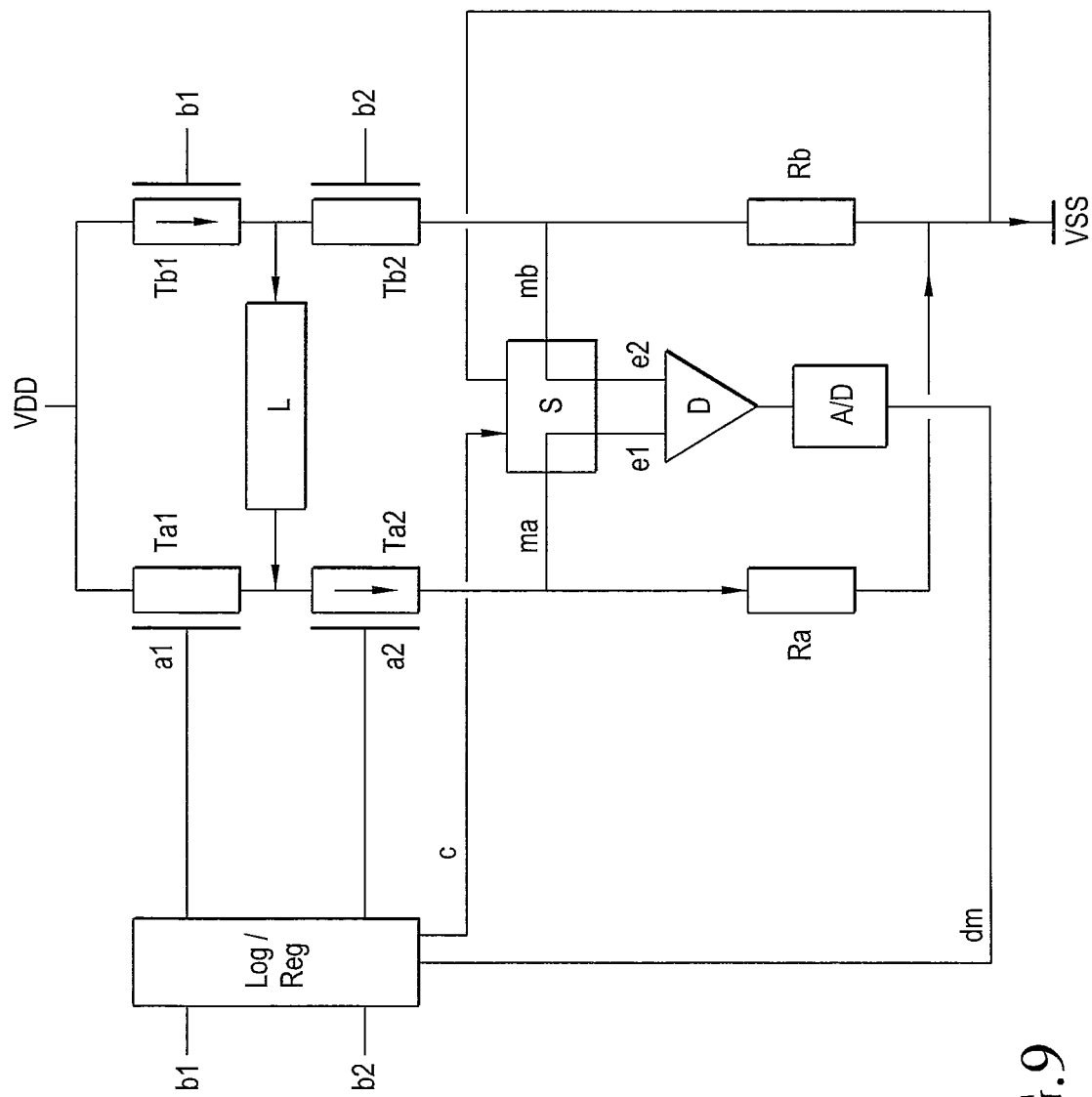
FIG. 9 shows the exemplary embodiment of the present invention illustrated in FIG. 8 in a driven phase, during which a drive current flows through the inductive load and one the two measurement resistors.
Figure 10:
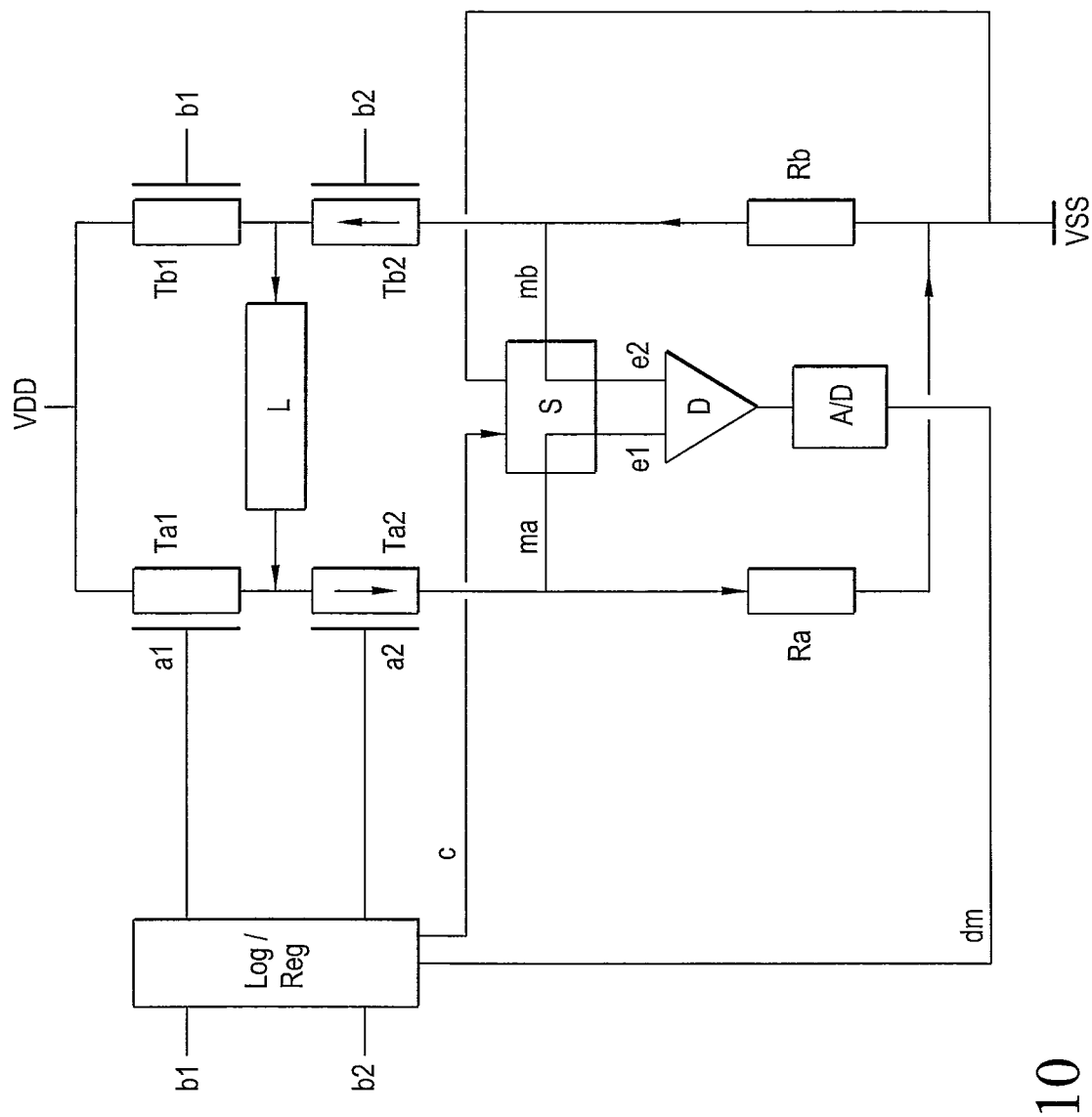
FIG. 10 shows the exemplary embodiment of the present invention illustrated in FIG. 8 in a recirculation phase, during which the recirculation current flows through both measurement resistors.

FIG. 8 now shows a further embodiment of the invention, in which switches S are provided which—as is indicated in FIGS. 9 and 10—connect the inputs of the differential amplifiers D backward and forward between the measurement points ma, mb and ground (VSS), depending on whether the circuit is in a drive phase 181 (FIG. 9) or in a recirculation phase (FIG. 10) at that time. This measure means that the output signal from the differential amplifiers D in the circuit shown in FIG. 8 responds as is shown in FIG. 12b. The discontinuities are overcome and, except for constant factors, the signal corresponds to the current in each phase of operation.

This embodiment has the advantage that the output signal corresponds exactly to the current profile in the inductive load, and can be correctly filtered for digital sampling using simple, conventional means.

As is illustrated in FIGS. 8, 9 and 10 on the basis of one preferred exemplary embodiment of the invention, this measure of the present invention makes it possible for the differential amplifiers D to measure the respective voltages themselves, rather than to measure the differences between the voltages mb and ma, in the intermediate phases 182 during which the current direction is reversed. This measure results in a signal which corresponds to the current in the inductive load at all times.

In this case, the voltage itself is preferably measured instead of the differences in the intermediate phases 182. For this purpose, the present invention provides for one of the two inputs (11, 12) of the differential amplifier (D) to be connected to ground (VSS) or to the supply voltage (VDD) and not one of the two measurement resistors (Ra, Rb) when the current through the inductive load flows through both measurement resistors at the same time.

This overcomes the discontinuities shown in FIGS. 11A, 12A. Qualitatively speaking, the resultant signal corresponds to the time profile of the current through the inductance as shown in FIGS. 11B, 12B. The invention therefore overcomes discontinuities or very steep flanks in the measurement variables, and the signal is always proportional to the current in the inductive load. Correct filtering, in the sense of the sampling theorem, can therefore be carried out using simple means for the subsequent digital sampling, thus avoiding the known aliasing problems.

The resulting improvement in the accuracy of the current measurement in the control circuit according to the invention makes a major improvement to the superordinate control circuit, for example, control for stepping motors. This results in a wider control bandwidth, which leads to smaller position errors and to shorter motor transients at the intended position.

Because the current measurement no longer infringes the sampling theorem, this avoids higher-frequency disturbances being down-mixed into low-frequency ranges. This results in a major improvement to the smooth running of the stepping motor, and higher control stiffnesses can be achieved.

FIG. 13 shows a partial circuit of a circuit arrangement according to the invention, according to one preferred embodiment of the present invention, which is intended to illustrate the low level of circuitry complexity which can be achieved with the solution according to the invention. By way of example, in order to produce the control signal c which is required to control the switching device S, the input signals (for example the "gate inputs" a2, b2) of the two switching elements Ta2 and Tb2 can be logically linked by a simple AND gate which, for example, can be implemented very easily in hardware in the form of a so-called "wired-AND", using diodes. Another option, for example, is to produce the control signal c by means of a microprocessor, which may be required in any case.

A further preferred embodiment of the present invention, which is illustrated by the modified partial circuit shown in FIG. 14, provides for the output signal from the differential amplifier (D) to be subjected to analog/digital conversion (A/D) after low-pass filtering (TP). In this case, by way of example, passive RC or LC filters or combinations thereof, together with A/D sampling, can be used as a low-pass filter. However, it is also possible to use active low-pass filters or combinations of active and passive low-pass filters which, for example, can be provided cost-effectively with the aid of differential amplifiers D which are required in any case, for example as shown in FIG. 15. The digital signal obtained in this way can then also be processed further by digital filtering, and, for example, can be supplied to a digital current regulator.

Filtering such as this also eliminates disturbances which are caused by switching effects and by an adjacent bridge circuit, which may be provided, for controlling a second inductive load, for example a further motor winding.

Appropriately designed embodiments of the invention are associated with the advantage that each half-bridge (Ta1, Ta2 and Tb1, Tb2) is provided with its "own" measurement resistor, on which two independent measurements are carried out. Complex demodulation can therefore be replaced by a simple subtraction circuit with one operational amplifier (D). This operational amplifier is preferably at the same time used to amplify the signal, as a result of which it is also possible to use very low-value measurement resistors.

Instead of using measurement resistors, it is also possible to use other measurement devices for current measurement in order to implement the invention, such as Hall sensors. When a current flows through a Hall sensor and it is moved into a magnetic field running at right angles thereto, it produces an output voltage which is proportional to the product of the magnetic field strength and the current. If the current is known, the magnetic field strength can be measured; if the magnetic field is produced by a conductor through which a current is flowing or by a coil, the current level in this conductor or the coil can be measured in a floating form.

The invention claimed is:

1. A method for measurement of the current through an inductive load (L), into which the current is fed with the aid of a full-bridge circuit (Ta1, Ta2, Tb1 and Tb2) which has two series circuits of switching elements (Ta1, Ta2 and Tb1, Tb2, respectively) connected in parallel, the method comprising:
    a) a voltage is tapped off from each of two measurement devices (Ra, Rb), which voltage is a measure of the current through the respective measurement device (Ra, Rb), wherein in each case one measurement device is arranged between in each case one series circuit of switching elements and ground (VSS) or the supply voltage (VDD);
    b) these voltages are supplied to a differential amplifier (D), whose inputs (e1, e2) are respectively connected to one of the two measurement devices (Ra, Rb);
    c) with the aid of a switching device (S), one of the two inputs (e1, e2) of the differential amplifier (D) is selectively connected to ground (VSS) or the supply voltage (VDD) or to one of the two measurement devices (Ra, Rb); and
    d) wherein when the current through the inductive load L flows through both measurement devices (Ra, Rb) at the same time, one of the two inputs (e1, e2) of the differential amplifier (D) is connected to ground (VSS) or to the supply voltage (VDD) and not one of the two measurement devices (Ra, Rb).

2. The method according to claim 1, in which the output signal from the differential amplifier (D) is subjected to analog/digital conversion (A/D) after low-pass filtering (TP).

3. A circuit arrangement for measurement of the current through an inductive load (L), into which the current is fed with the aid of a full-bridge circuit (Ta1, Ta2, Tb1, Tb2) which has two series circuits of switching elements (Ta1, Ta2, Tb1, Tb2), connected in parallel, the circuit arrangement comprising:
    a) two measurement devices (Ra, Rb) are provided, on each of which a voltage is tapped off which is a measure of the current through the respective measurement device (Ra, Rb), wherein in each case one measurement device is arranged between in each case one series circuit of switching elements and ground (VSS) or the supply voltage (VDD);
    b) these voltages are supplied to a differential amplifier (D) through a switching device (S), said differential amplifier (D) having two inputs (e1, e2) where each of these voltages is fed to one of the inputs (e1, e2) of the differential amplifier, respectively; and
    c) a switching device (S) is provided, with the aid of which one of the two inputs (e1, e2) of the differential amplifier (D) can be selectively connected to ground (VSS) or the supply voltage (VDD) or to one of the two measurement devices (Ra, Rb),
    d) wherein the switching device (S) is designed to selectively connect one of the two inputs (e1, e2) of the differential amplifier (D) to either ground (VSS) or to the supply voltage (VDD) when the current through the inductive load L flows through both measurement devices (Ra, Rb) at the same time.

4. The circuit arrangement according to claim 3, in which the output signal from the differential amplifier (D) is subjected to analog/digital conversion (A/D) after low-pass filtering (TP).

* * * * *